US011373725B2

(12) United States Patent
Liang et al.

(10) Patent No.: US 11,373,725 B2
(45) Date of Patent: Jun. 28, 2022

(54) ERROR CORRECTION CODE CIRCUITS HAVING ONE-TO-ONE RELATIONSHIPS WITH INPUT/OUTPUT PADS AND RELATED APPARATUSES AND METHODS

(71) Applicant: Micron Technology, Inc., Boise, ID (US)

(72) Inventors: Zer Liang, Tokyo (JP); Minari Arai, Saitama (JP); Takuya Nakanishi, Ibaraki (JP)

(73) Assignee: Micron Technology, Inc., Boise, ID (US)

( * ) Notice: Subject to any disclaimer, the term of this patent is extended or adjusted under 35 U.S.C. 154(b) by 61 days.

(21) Appl. No.: 16/912,214

(22) Filed: Jun. 25, 2020

(65) Prior Publication Data

US 2021/0407611 A1    Dec. 30, 2021

(51) Int. Cl.
*G11C 29/42*  (2006.01)
*G11C 29/44*  (2006.01)
*G11C 29/14*  (2006.01)
*G11C 29/12*  (2006.01)
*G11C 7/22*   (2006.01)
*G11C 7/06*   (2006.01)

(52) U.S. Cl.
CPC .............. *G11C 29/42* (2013.01); *G11C 7/065* (2013.01); *G11C 7/222* (2013.01); *G11C 29/1201* (2013.01); *G11C 29/14* (2013.01); *G11C 29/44* (2013.01)

(58) Field of Classification Search
CPC ......... G11C 29/42; G11C 7/065; G11C 7/222; G11C 29/1201; G11C 29/14; G11C 29/44
See application file for complete search history.

(56) References Cited

U.S. PATENT DOCUMENTS

| 6,490,243 | B1 * | 12/2002 | Tanaka ............. H03M 13/6362 370/216 |
| 2013/0275391 | A1 * | 10/2013 | Batwara ................ G06F 16/125 707/689 |
| 2014/0013187 | A1 * | 1/2014 | Blaunstein .......... G06F 13/1689 714/773 |
| 2014/0317470 | A1 * | 10/2014 | Chung ................ G06F 11/1076 714/764 |
| 2017/0115891 | A1 * | 4/2017 | O'Krafka .............. G06F 3/0604 |

* cited by examiner

*Primary Examiner* — Kyle Vallecillo
(74) *Attorney, Agent, or Firm* — TraskBritt

(57) ABSTRACT

Error correction control (ECC) circuits for memory devices and related apparatuses, systems, and methods are disclosed. An apparatus includes an ECC control circuit input configured to receive read data from a plurality of memory banks of a memory cell array via a single set of shared main input/output (MIO) lines. The single set of shared MIO lines are shared by the plurality of memory banks. The apparatus also includes a single ECC control circuit configured to generate corrected read data responsive to the read data received by the ECC control circuit input. The apparatus further includes an ECC control circuit output configured to provide the corrected read data generated by the single ECC control circuit to a global data bus.

25 Claims, 8 Drawing Sheets

ERROR CORRECTION CODE CIRCUITS HAVING ONE-TO-ONE RELATIONSHIPS WITH INPUT/OUTPUT PADS AND RELATED APPARATUSES AND METHODS

TECHNICAL FIELD

The present application relates generally to error correction code (ECC) control circuits, and more specifically to ECC control circuits in memory devices.

BACKGROUND

In design of memory devices there is constant pressure to decrease the power expended in operating memory devices and to decrease the amount of semiconductor chip area, commonly termed "real estate," occupied by circuitry of the memory devices. Although error correction code (ECC) capabilities in memory devices improve reliability in operation of the memory devices, circuitry used to provide ECC capabilities occupies non-negligible chip area, and consumes non-negligible amounts of power in operation.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
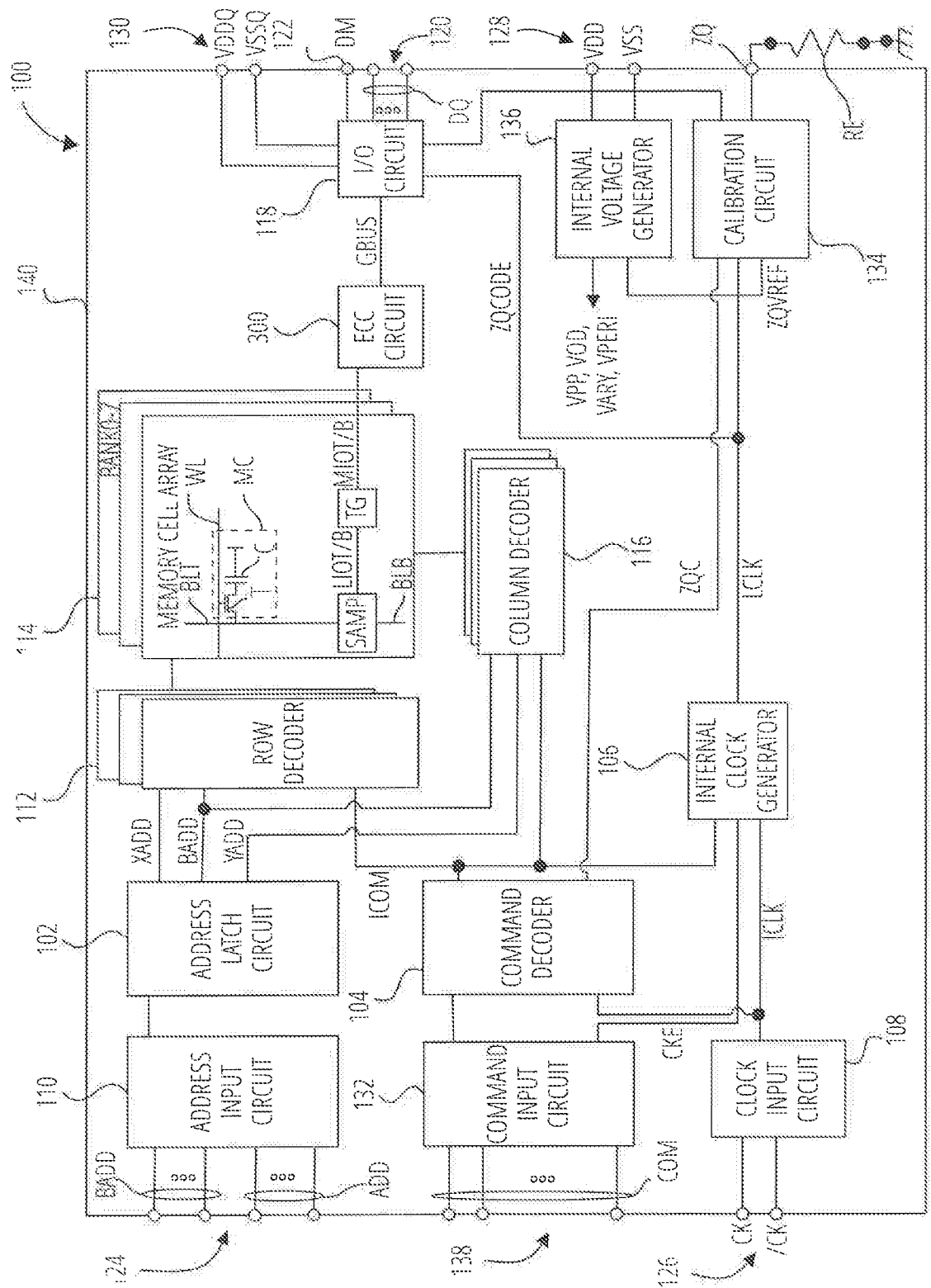
FIG. 1 is a block diagram of a semiconductor device, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

In memory devices, (e.g., low-power, double data rate (LPDDR) memory devices), one set of input/output (DQ) pads may be shared for all memory banks on a memory chip. One way to handle ECC capabilities in such a memory chip is to provide each memory bank on the memory chip with its own error correction code digital sense amplifier (ECCDSA) block. In this way read data may be driven onto a global data bus of the memory chip from the ECCDSA blocks of the memory banks before entering DQ first in first out (FIFO) buffers of the DQ pads. Timing for provision of corrected read data from the ECCDSA blocks onto the global data bus may be determined in these memory chips based on error correction code (ECC) parity generation delay. After ECC parity generation and data correction, the read data may be driven onto the data bus. In these memory devices timing for driving the corrected read data onto the global data bus may be determined using logic directed to ECC read replica. The ECC read replica emulates an ECC syndrome tree path (e.g., using exclusive OR (XOR) gates) and delay trim options to adjust timing. Due to the many logic gates in the replica path, current consumption during operation and chip space occupied by the logic gates are non-negligible. Moreover, the DQ FIFO may also occupy non-negligible chip area, consume current, and complicate design and operation of the memory device.

Embodiments disclosed herein eliminate reliance on a DQ FIFO and ECC read replica logic by employing a one-to-one relationship between a single ECC control circuit shared by each memory bank of a memory cell array and a single set of input/output (DQ) pads shared by each memory bank of the memory cell array. As a result, circuitry according to embodiments disclosed herein occupies less chip area and consumes less power than circuitry that includes DQ FIFO and ECC read replica logic.

In some embodiments an apparatus includes an ECC control circuit input, a single ECC control circuit, and an ECC control circuit output. The ECC control circuit input is configured to receive read data from a plurality of memory banks of a memory cell array via a single set of shared main input/output (MIO) lines. The single set of shared MIO lines are shared by the plurality of memory banks. The single ECC control circuit is configured to generate corrected read data responsive to the read data received by the ECC control circuit input. The ECC control circuit output is configured to provide the corrected read data generated by the single ECC control circuit to a global data bus.

In some embodiments an apparatus includes a plurality of memory banks, a single set of I/O pads, a data I/O circuit, a global data bus, and a single ECC control circuit. The plurality of memory banks are configured to store data thereon. The single set of I/O pads are shared by the plurality of memory banks. The data I/O circuit is electrically connected to the single set of I/O pads. The global data bus is operably coupled to the data I/O circuit. The single error correction code (ECC) control circuit is electrically connected between the plurality of memory banks and the data I/O circuit. The ECC control circuit has a one-to-one relationship with the single set of I/O pads. The single ECC control circuit is configured to receive read data read from the plurality of memory banks and provide corrected read data to the single set of input/output pads responsive to the read data.

In some embodiments an ECC control circuit has a one-to-one relationship with input/output pads shared by a plurality of memory banks of a memory cell array. In some embodiments a method of operating the ECC control circuit includes generating a parity signal responsive to read data received from the memory cell array. The read data corresponds to a read command. The method also includes decoding the parity signal to generate a decoded signal, and generating corrected read data responsive to the decoded signal and the read data. The method further includes driving the corrected read data to a global data bus a predetermined amount of time before expiration of a read latency period of time following the read command.

In some embodiments an apparatus includes a digital sense amplifier (DSA) configured to receive read data from any of a plurality of memory banks. The digital sense amplifier is configured to enable the DSA to operate responsive to an assertion of a DSA enable signal. The assertion of the DSA signal occurs a first predetermined number of clock cycles of a clock following a read command to retrieve the read data from the plurality of memory banks. The apparatus also includes a first latch configured to receive the read data and latch the read data to provide latched read data responsive to the DSA enable signal. The apparatus further includes a syndrome tree circuit configured to receive the latched read data and generate one or more parity bits responsive to the latched read data. The apparatus also includes a second latch configured to latch the one or more parity bits from the syndrome tree responsive to an assertion of a latch signal. The assertion of the latch signal occurs a second predetermined number of clock cycles prior to a read latency time. The read latency time is a read latency period of time following the read command. The second predetermined number of clock cycles is sufficient to provide the syndrome tree circuit sufficient time to generate the one or more parity bits. The apparatus further includes a decoder configured to generate a decoder signal responsive to the one or more latched parity bits, and a correction circuit configured to generate corrected read data responsive to the latched read data and the decoder signal. The apparatus additionally includes a global data bus (GBUS) driver configured to drive the corrected read data to a GBUS responsive to an assertion of a GBUS driver trigger signal, the GBUS driver trigger signal configured to assert a third predetermined number of clock cycles prior to the read latency time. In some embodiments the third predetermined number of clock cycles is two clock cycles. In some embodiments the apparatus is configured to operate according a first operational mode during which the clock is configured to cycle according to a first period and according to a second operational mode during which the clock is configured to cycle according to a second period that is longer than the first period. In some embodiments the third predetermined number of clock cycles is the same during the first operational mode as during the second operational mode. In some embodiments the first predetermined number of clock cycles is smaller in the second operational mode than in the first operational mode. In some embodiments the second predetermined number of clock cycles is greater in the second operational mode than in the first operational mode. In some embodiments the second predetermined number of clock cycles is five (5) in the second operational mode and four (4) in the first operational mode.

FIG. 1 is a block diagram of a semiconductor device 100, according to some embodiments. By way of non-limiting example, the semiconductor device 100 according to the embodiment is a DRAM (dynamic random access memory) of DDR4 (Double Data Rate 4) type integrated on a single semiconductor chip, and is mounted on a substrate 140. The substrate 140 is a memory module substrate or a motherboard, and is provided with a resistor RE. The resistor RE is connected to a calibration terminal ZQ of the semiconductor device 100, and impedance thereof is used as a reference impedance of a calibration circuit 134. In this embodiment, the resistor RE is supplied with a ground voltage potential VSS.

As shown in FIG. 1, the semiconductor device 100 includes a memory cell array 114. The memory cell array 114 is divided into eight banks BANK0 to BANK7. Each of the banks BANK0 to BANK7 is provided with a plurality of word lines WL and a plurality of bit lines BLT, BLB, and a memory cell MC is disposed at an intersection of these lines. By way of non-limiting example, the memory cell MC may be a DRAM cell having a cell transistor T and a memory cell capacitor C connected in series with the cell transistor T.

Selection of the word line WL is performed by a row decoder 112, while selection of the bit line BL is performed by a column decoder 116. As shown in FIG. 1, the row decoder 112 and the column decoder 116 are provided for each of BANK0 to BANK7.

The bit lines BLT, BLB are electrically connected to a sense amplifier SAMP. Read data read from the bit line BLT or the bit line BLB is amplified by the sense amplifier SAMP, and thereafter transferred to an ECC control circuit 300 via complementary local data lines LIOT/LIOB, a switch circuit TG (transfer gate), and complementary main data lines MIOT/MIOB. A single ECC control circuit 300 is provided for all of the memory banks BANK0 to BANK7 to share. Accordingly, a one-to-one relationship exists between the ECC control circuit 300 and the data terminals 120. In other words, the semiconductor device 100 includes one set of I/O pads (e.g., DQ pads) at the data terminals 120 for a single ECC control circuit 300, which is shared by all of the memory banks BANK0 to BANK7 of the memory cell array 114. This one-to-one relationship enables simplification of DQ output, as compared to semiconductor devices that use separate ECC control circuits for each of the memory banks of a memory cell array. For example, a first-in, first-out (FIFO) buffer at the data input/output circuit 118 and ECC replica logic may not be required because the ECC control circuit 300 may manage timing for providing the corrected read data to the global data bus GBUS as discussed in more detail below.

When the read data is read from the memory cell array 114, a parity is generated by the ECC control circuit 300. Write data outputted from the ECC control circuit 300 is transferred to the sense amplifier SAMP via the complementary main data lines MIOT/MIOB, the switch circuit TG, and the complementary local data lines LIOT/LIOB, and written in the memory cell MC connected to the bit line BLT or the bit line BLB. The write data is written in the memory cell array 114.

Further, the semiconductor device 100 is provided with address terminals 124, command terminals 138, clock terminals 126, data terminals 120, data mask terminal 122, voltage terminals 128, voltage terminals 130, and a calibration terminal ZQ as external terminals.

The address terminals 124 are terminals into which an address signal ADD and a bank address signal BADD are inputted from outside. The address signal ADD inputted in the address terminals 124 is supplied to an address latch circuit 102 via an address input circuit 110, and latched therein. Of signals latched by the address latch circuit 102, a row address signal XADD and a bank address signal BADD are supplied to the row decoder 112, while a column address signal YADD and the bank address signal BADD are supplied to the column decoder 116.

One of row decoder 112 corresponding to BANK0 to BANK7 is selected on the basis of the bank address signal BADD, and selects a predetermined word line WL on the basis of the row address signal XADD. One of column decoder 116 corresponding to BANK0 to BANK7 is selected on the basis of the bank address signal BADD, and selects a predetermined sense amplifier SAMP on the basis of the column address signal YADD.

The command terminals 138 are terminals into which a command signal COM is inputted from outside. The command signal COM inputted in the command terminals 138 is supplied to a command decoder 104 via a command input circuit 132. The command decoder 104 is a circuit decoding the command signal COM and thereby generating various internal commands ICOM. The internal commands ICOM are supplied to the row decoder 112, the column decoder 116, and the like.

For example, if an active command and a read command are inputted as the command signals COM, and, in synchronism therewith, the row address XADD and the column address YADD are inputted, read data is read from the memory cell MC designated by these row address XADD and column address YADD. The read data is inputted into the ECC control circuit 300, and if an error bit is contained in the read data, the read data is corrected. The corrected read data DQ is provided to a global data bus GBUS (e.g., a read/write bus (RWBS)), and burst-outputted from the data terminals 120 to outside via a data input/output circuit 118. Though not particularly limited, the embodiment is provided with eight terminals of the data terminals 120 (DQ0 to DQ7), and, during read operation, read data of 8 bits DQ is burst-outputted from each terminal of the data terminals 120. Accordingly, read data of 64 bits DQ is outputted in one read operation.

On the other hand, if an active command and a write command are inputted as the command signals COM, in synchronism therewith, the row address XADD and the column address YADD are inputted, and thereafter write data DQ is burst-inputted into the data terminals 120, the write data DQ is supplied by the global data bus GBUS to the ECC control circuit 300 via the data input/output circuit 118. The write data is supplied to the memory cell array 114, and written into the memory cell MC designated by the row address XADD and the column address YADD. As described above, when eight terminals of the data terminals 120 are provided and the burst number is eight bits, write data of 64 bits DQ is inputted in one write operation.

During the write operation, a data mask signal DM can be inputted into the data mask terminal 122. If the data mask signal DM is inputted, corresponding burst data of the write data DQ to be burst-inputted is masked.

External clock signals CK, /CK are inputted into the clock terminals 126. The external clock signal CK and the external clock signal/CK are signals complementary to each other, and both the external clock signals are supplied to the clock input circuit 108. The clock input circuit 108 generates an internal clock signal ICLK responsive to the external clock signals CK, /CK. The internal clock signal ICLK is supplied to an internal clock generator 106, and thereby a phase-controlled internal clock signal LCLK is generated. Though not particularly limited, a DLL circuit can be used as the internal clock generator 106. The phase-controlled internal clock signal LCLK is supplied to the data input/output circuit 118, and used as a timing signal determining an output timing of the read data DQ. It should be noted that the internal clock generator 106 is activated in response to a clock enable signal CKE that is one of the command signals COM.

The voltage terminals 128 are terminals supplied with voltage potentials VDD, VSS. The voltage potentials VDD, VSS supplied to the voltage terminals 128 are supplied to the internal voltage generator 136. The internal voltage generator 136 generates various internal voltage potentials VPP, VOD, VARY, VPERI, and a reference voltage potential ZQVREF on the basis of the voltage potentials VDD, VSS. The internal voltage potential VPP is a voltage potential mainly used in the row decoder 112, the internal voltage potentials VOD, VARY are voltage potentials used in the sense amplifier SAMP in the memory cell array 114, and the internal voltage potential VPERI is a voltage potential used in many other circuit blocks. On the other hand, the reference voltage potential ZQVREF is a reference voltage potential used in the calibration circuit 134.

The voltage terminals 130 are terminal supplied with voltage potentials VDDQ, VSSQ. The voltage potentials VDDQ, VSSQ supplied to the voltage terminals 130 are supplied to the data input/output circuit 118. The voltage potentials VDDQ, VSSQ are the same voltage potentials as the voltage potentials VDD, VSS supplied to the voltage terminals 128, respectively, but, in order to prevent voltage noise caused by the data input/output circuit 118 from propagating to the other circuit blocks, the voltage potentials VDDQ, VSSQ dedicated to the data input/output circuit 118 are used.

The calibration terminal ZQ is connected to the calibration circuit 134. When being activated by a calibration signal ZQC, the calibration circuit 134 performs a calibration operation with reference to the impedance of the resistor RE and the reference potential ZQVREF. An impedance code ZQCODE obtained by the calibration operation is supplied to the data input/output circuit 118, and thereby the impedance of an output buffer (not shown) included in the data input/output circuit 118 is designated.

Figure 2:
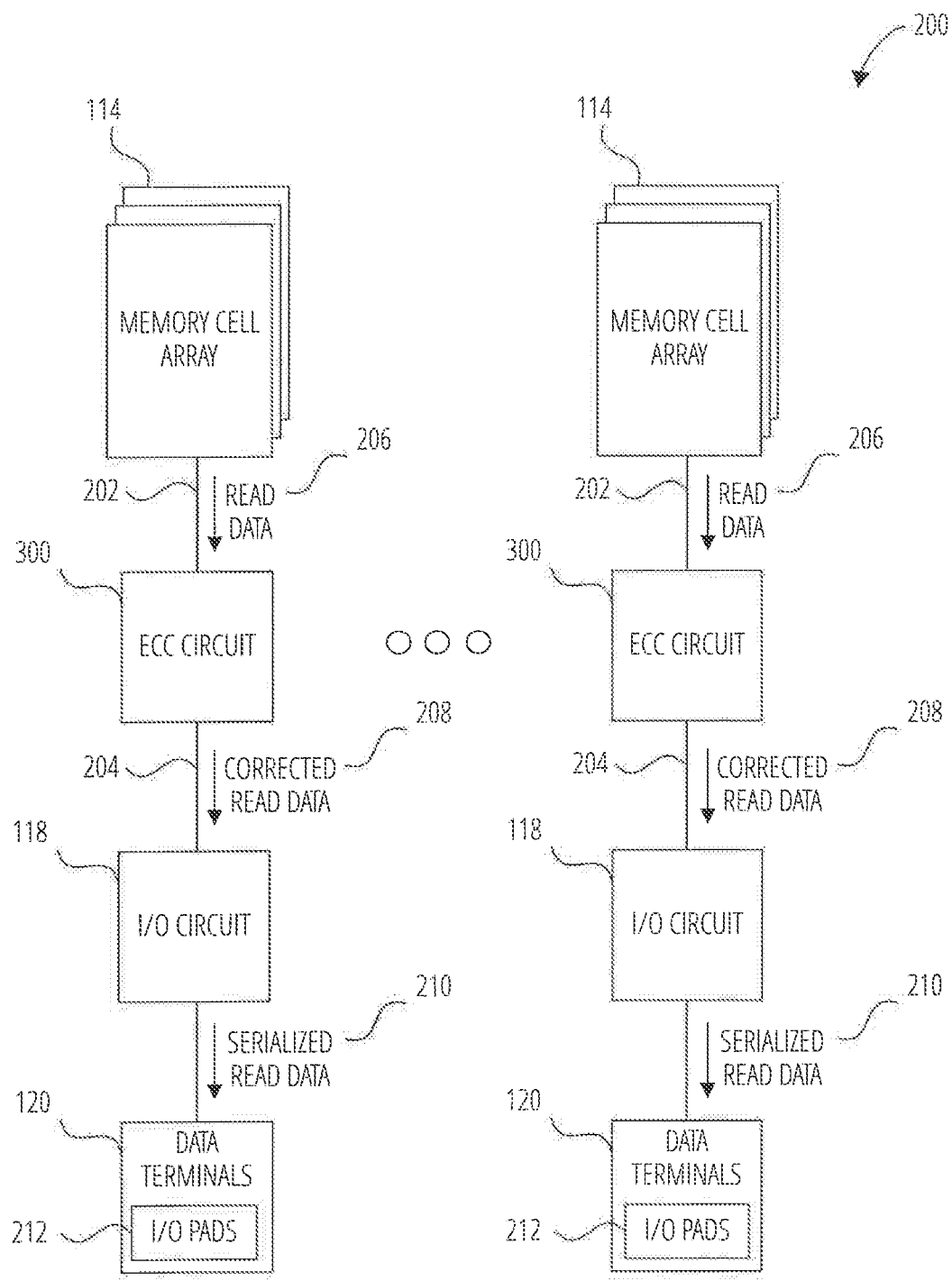
FIG. 2 is a block diagram of a memory device, according to some embodiments.

FIG. 2 is a block diagram of a memory device 200, according to some embodiments. The memory device 200 includes multiple memory cell arrays, each similar to the memory cell array 114 discussed with reference to FIG. 1. The memory device 200 also includes multiple ECC circuits, each similar to the ECC control circuit 300 of FIG. 1. The memory device 200 further includes multiple sets of data terminals, each similar to the data terminals 120 of FIG. 1. Each memory cell array 114 is operably coupled to an ECC control circuit 300 via main input/output lines (MIO lines 202). As a result, all the memory banks in each memory cell array 114 share a common set of MIO lines 202 operably coupling the memory cell array 114 to its corresponding ECC control circuit 300. In some embodiments, each memory cell array 114 and its corresponding ECC MIO lines 202, ECC control circuit 300, global data bus GBUS 204, data input/output circuit 118, and data terminals 120 corresponds to a separate memory chip.

Each ECC control circuit 300 is operably coupled to its corresponding data input/output circuit 118 via a global data bus GBUS 204. Each ECC control circuit 300 is configured to receive the read data 206 provided by the corresponding memory cell array 114 and generate corrected read data 208 responsive to the read data 206 received from the memory cell array 114. The ECC control circuit 300 is configured to provide the corrected read data 208 to its corresponding data terminals 120 via global data bus GBUS 204.

The data input/output circuit 118 is operably coupled to its corresponding data terminals 120. The data input/output circuit 118 is configured to receive the corrected read data 208 from the ECC control circuit 300 via the global data bus GBUS 204, serialize the corrected read data 208 to produce serialized read data 210, and provide the serialized read data 210 to the data terminals 120. The data terminals 120 include I/O pads 212 (e.g., DQ pads).

A one-to-one relationship exists between each set of I/O pads 212 and its corresponding ECC control circuit 300. In other words, single ECC control circuit 300 is operably coupled to a single set of I/O pads 212 (via the global data bus GBUS 204 and the data input/output circuit 118). As a result, the data input/output circuit 118 does not include a FIFO buffer operably coupled to multiple ECC control circuits that each correspond do a single memory bank. Accordingly, the interface between the ECC control circuit 300 and the data terminals 120 is simpler compared to interfaces between ECC control circuits and data terminals that do not implement a one-to-one relationship.

Figure 3:
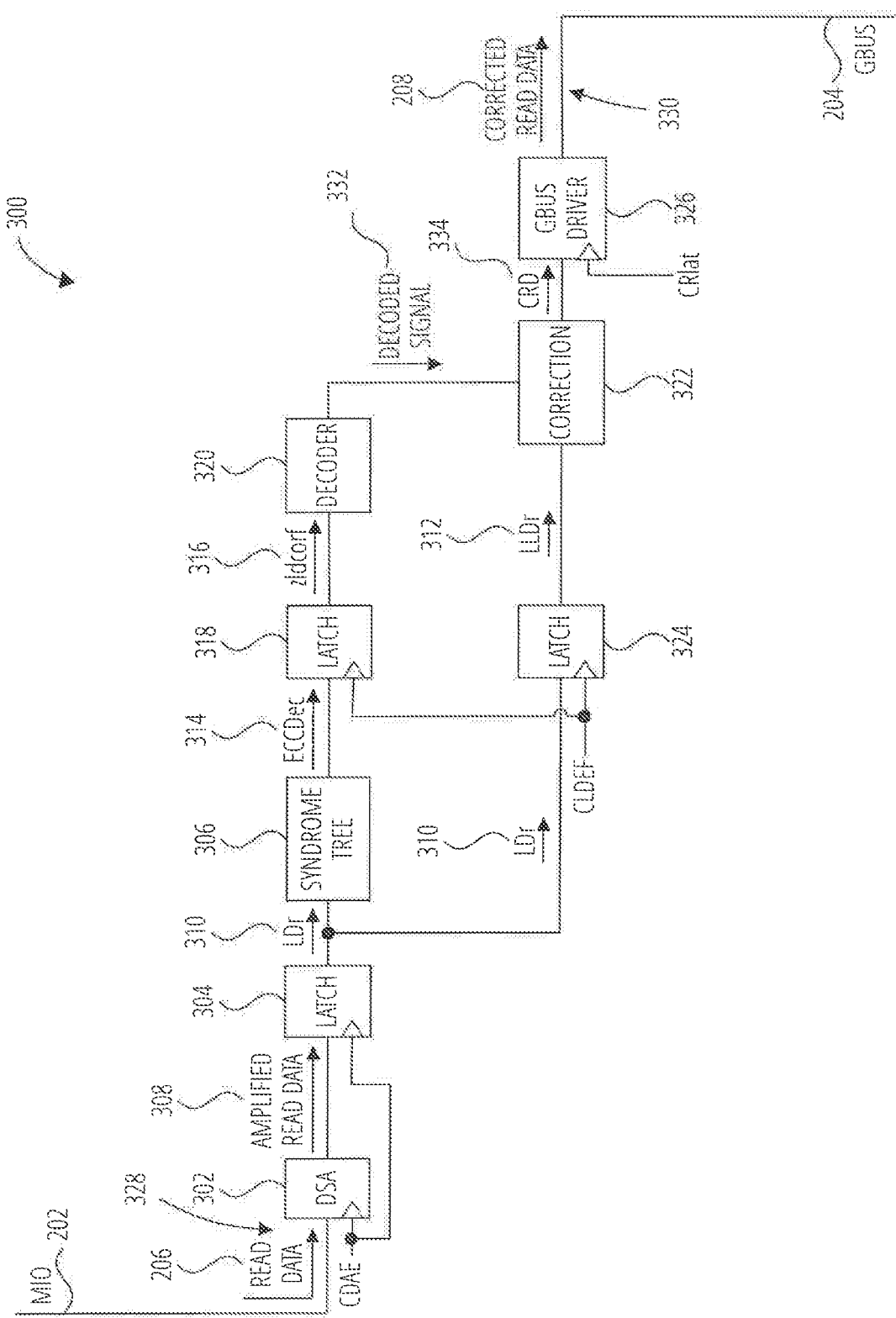
FIG. 3 is a block diagram of an ECC control circuit of FIG. 1 and FIG. 2, according to some embodiments.

FIG. 3 is a block diagram of an ECC control circuit 300 of FIG. 1 and FIG. 2, according to some embodiments. The ECC control circuit 300 illustrated in FIG. 3 includes an ECC control circuit input 328 operably coupled to the MIO lines 202 of FIG. 2. The ECC control circuit 300 also includes an ECC control circuit output 330 operably coupled to the global data bus GBUS 204 of FIG. 2. The ECC control circuit 300 further includes a digital sense amplifier (DSA 302) operably coupled to the ECC control circuit input 328, a latch 304 operably coupled to the DSA 302, a syndrome tree circuit 306 operably coupled to the latch 304, a latch 318 operably coupled to the syndrome tree circuit 306, and a decoder 320 operably coupled to the latch 318. The ECC control circuit 300 also includes a latch 324 operably coupled to the latch 304, a correction circuit 322 operably coupled to the latch 324, and a GBUS driver 326 operably coupled between the correction circuit 322 and the ECC control circuit output 330. As previously discussed, the ECC control circuit 300 is configured to receive, at the ECC control circuit input 328, read data 206 from a memory cell array 114 (FIG. 1 and FIG. 2), and provide, at the ECC control circuit output 330, corrected read data 208 to the global data bus GBUS 204.

The ECC control circuit input 328 of the ECC control circuit 300 is configured to receive read data 206 from one of the memory banks of the memory cell array 114 corresponding to the ECC control circuit 300 via the MIO lines 202. The read data 206 is provided to the DSA 302 and the DSA 302 is enabled by a DSA enable signal CDAE provided by the memory cell array 114 to the ECC control circuit 300. By way of non-limiting example, bank logic of the memory cell array 114 may generate the DSA enable signal CDAE and provide the DSA enable signal CDAE to the ECC control circuit 300. Responsive to an assertion of the DSA enable signal CDAE (e.g., a transition from a first logic level not associated with triggering the DSA 302 to a second logic level associated with triggering the DSA 302), the DSA 302 is configured to amplify the read data 206 to generate amplified read data 308, and provide the amplified read data 308 to the latch 304.

The latch 304 is configured to latch the amplified read data 308 provided to the latch 304 by the DSA 302 responsive to the DSA enable signal CDAE to generate latched read data LDr 310. The latch 304 is configured to provide the amplified read data 308 to the syndrome tree circuit 306 and the latch 324. The syndrome tree circuit 306 is configured to receive the latched read data LDr 310 and generate one or more parity bits responsive to the latched read data LDr 310, and provide the one or more parity bits in an ECC decode signal ECCDec 314 to the latch 318.

The latch 318 is configured to receive the ECC decode signal ECCDec 314 from the syndrome tree circuit 306, and latch the one or more parity bits in parity signal zldcorf 316 responsive to a latch signal CLDEF. The latch 318 is configured to provide the latched parity signal zldcorf 316 to the decoder 320. The latch 324 is configured to latch the latched read data LDr 310 responsive to the latch signal CLDEF to generate latched read data LLDr 312. The latch 324 is configured to provide the latched read data LLDr 312 to the correction circuit 322. As the latch 318 and the latch 324 are both triggered by the same latch signal CLDEF, parity signal zldcorf 316 is provided to the decoder 320 at substantially the same time as LLDr 312 is provided to the correction circuit 322.

The decoder 320 is configured to receive the parity signal zldcorf 316 and generate a decoded signal 332 responsive to the parity signal zldcorf 316. The decoder 320 is configured to provide the decoded signal 332 to the correction circuit 322.

The correction circuit 322 is configured to receive the latched read data LLDr 312 from the latch 324 and the decoded signal 332 from the decoder 320. The correction circuit 322 is configured to determine whether one or more errors are present in the latched read data LLDr 312 responsive to the decoded signal 332. Responsive to a determination that one or more errors are present in the latched read data LLDr 312, the correction circuit 322 is configured to correct the latched read data LLDr 312 to generate corrected read data CRD 334. Responsive to a determination that there are no errors present in the latched read data LLDr 312, the correction circuit 322 is configured to pass the latched read data LLDr 312 as the corrected read data CRD 334. The correction circuit 322 is configured to provide the corrected read data CRD 334 to the GBUS driver 326.

The GBUS driver 326 is configured to receive the corrected read data CRD 334 from the correction circuit 322 and drive the corrected read data CRD 334 to generate corrected read data 208 responsive to a GBUS driver trigger signal CRlat. The GBUS driver 326 is configured to provide the corrected read data 208 through the ECC control circuit output 330 to the global data bus GBUS 204.

Rather than relying on an ECC replica and a delay block to account for the computational delay added by the syndrome tree circuit 306, timing for triggering of the latch 318, the latch 324, and the GBUS driver 326 may be determined from known system parameters such as read latency (RL). It may be known how much time it takes from reception of a read command to delivery of the read data 206 to the ECC control circuit 300. It may also be known how much time the syndrome tree circuit 306 takes to generate the ECCDec 314. As a result, the DSA enable signal CDAE and the latch signal CLDEF may be timed according to these known parameters.

Also, by way of non-limiting example, if it is known that it takes less than two clock cycles but more than one clock cycle for the GBUS driver 326 to drive the corrected read data 208 onto the global data bus GBUS 204, the GBUS driver trigger signal CRlat may be set to trigger the GBUS driver 326 two clock cycles before a read latency period of time (RL-2) following a read command that triggers provision of the read data 206 to the ECC control circuit 300. As a further non-limiting example, if it is known that it takes less than three clock cycles but more than two clock cycles for the GBUS driver 326 to drive the corrected read data 208 onto the global data bus GBUS 204, the GBUS driver trigger signal CRlat may be set to trigger the GBUS driver 326 three clock cycles before the read latency period of time (RL-3) following a read command that triggers provision of the read data 206 to the ECC control circuit 300.

Since the ECC control circuit 300 does not include an ECC replica or a delay block to account for the computational delay added by the syndrome tree circuit 306, the ECC control circuit 300 may have improved power and chip space as compared to ECC control circuits that include ECC replicas and/or delay blocks to account for computational delays added by syndrome tree circuits. For example, an ECC replica may include extensive logic circuitry (e.g., exclusive OR (XOR) gates), which occupy relatively large amounts of chip space and consume non-negligible amounts of electrical current. As a result, the exclusion of such circuitry from the ECC control circuit 300 results in reduced electrical power consumption during operation and reduced chip space occupancy required to manufacture the ECC control circuit 300.

Figure 4:
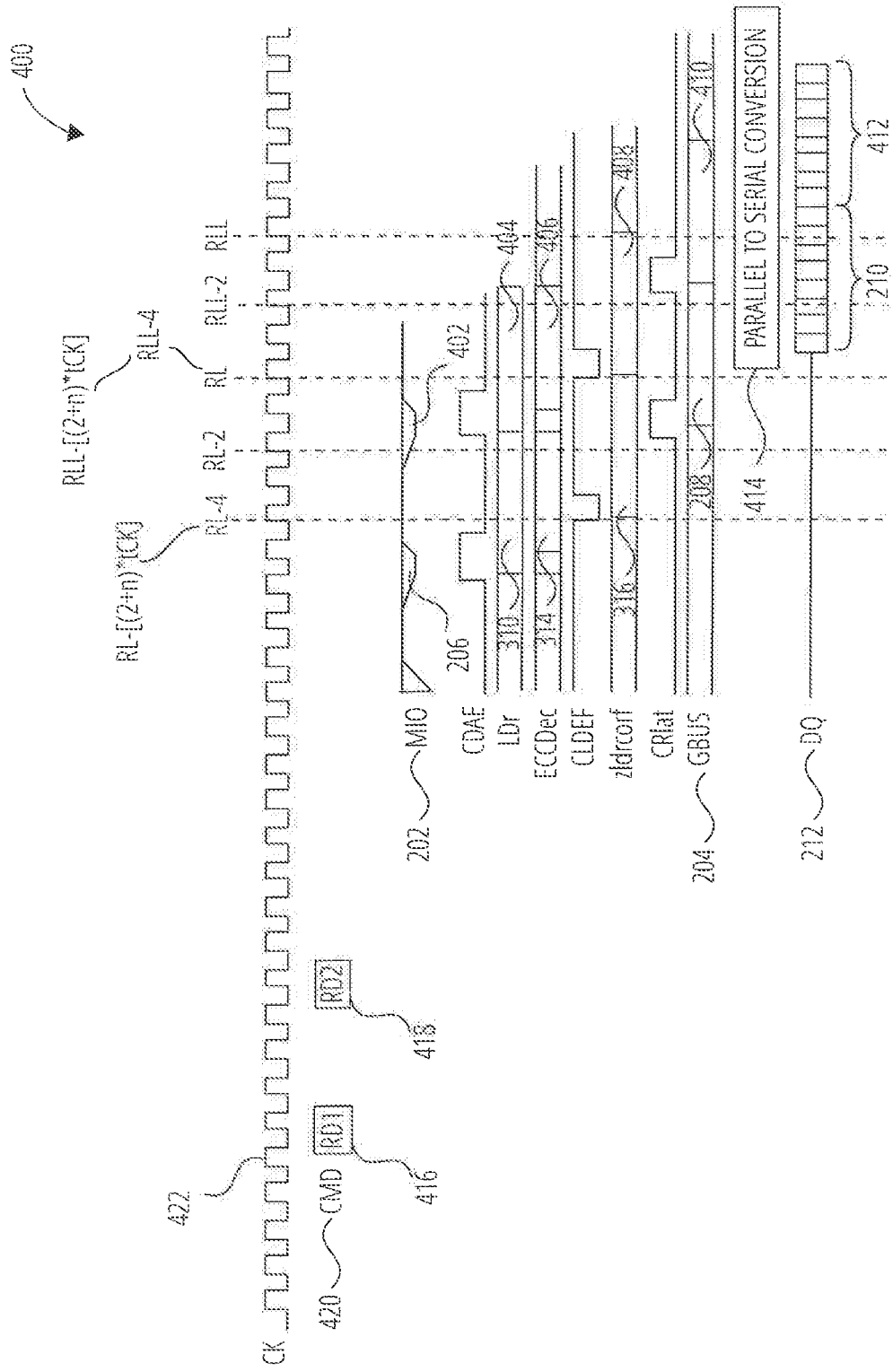
FIG. 4 is a signal timing diagram of example signals that may be observed in the ECC control circuit of FIG. 3.

FIG. 4 is a signal timing diagram of example signals 400 that may be observed in the ECC control circuit 300 of FIG. 3. Referring to FIG. 3 and FIG. 4 together, the signals 400 include a clock signal 422 (CK, which may be the internal clock ICK of FIG. 1, without limitation), commands 420 (CMD) including a first read command 416 and a second read command 418, read data 206 and read data 402 on MIO lines 202, DSA enable signal CDAE, latched read data LDr 310 and LDr 404, ECC decode signals ECCDec 314 and ECCDec 406, latch signal CLDEF, parity signals zldcorf 316 and zldcorf 408, GBUS driver trigger signal CRlat, corrected read data 208 and corrected read data 410 on global data bus GBUS 204, and serialized read data 210 and serialized read data 412 on I/O pads 212 (DQ).

The first read command 416 may be received (e.g., by the memory cell array 114 (FIG. 1 and FIG. 2). In some embodiments, a read command such as read command 416 may start with an assertion of a read column select (read CS) signal (e.g., received by the memory cell array 114 (FIG. 1) from the column decoder 116). As a result, read data 206 may be transferred on the bit lines (e.g., BLT, BLB of FIG. 1) to the LIOT/B lines (FIG. 1) of the memory cell array 114. The read data 206 is transferred, via the transfer gate TG (FIG. 1), to the MIOT/B lines (FIG. 1, corresponding to MIO lines 202 of FIG. 4), and as a result, the memory cell array 114 may provide the read data 206 to the ECC control circuit 300 via the MIO lines 202. The DSA enable signal CDAE may be asserted (by transitioning from a logic level low to a logic level high in FIG. 4) a predetermined period of time following the first read command 416 (i.e., from the read CS signal). The DSA enable signal CDAE may be an analog delay signal that tracks the data path triggered by the read CS signal corresponding to the first read command 416. The syndrome tree circuit 306 receives the latched read data LDr for parity generation and provides the ECC decode signal ECCDec 314 to the latch 318.

For the correct read data to be driven onto the global data bus GBUS 204 at RL-2, the ECCdec signal 314 is latched responsive to CLDEF at a clock cycle that is after a delay period of time sufficient to account for the delay through the syndrome tree circuit 306. The latch signal CLDEF may be asserted a number n of clock periods before two clock periods before the read latency time, denoted RL, according to RL−[(2+n)*tCK]. In other words, the latch signal CLDEF may be asserted at time RL−[(2+n)*tCK], where n is an integer value and tCK depends on the frequency of the clock signal 422 (e.g., tCK may be the period of the clock signal 422). In the example of FIG. 4 the latch signal CLDEF is asserted four clock cycles before RL (RL-2-2, corresponding to n=2). As a result, the latch signal CLDEF asserts (transitioning from a logic level high to a logic level low in FIG. 4) at RL-4 to give the syndrome tree circuit 306 sufficient time to generate the ECC decode signal ECCDec 314. In response, the parity signal zldcorf 316 is latched to the decoder 320, the decoder 320 receives the parity signal zldcorf 316, and the correction circuit 322 receives the latched read data LLDr 312 and the decoded signal 332. The parity signal zldcorf 316 is valid for the entire window until CRlat finishes driving the read data onto the global data bus GBUS 204. The correction circuit 322 provides the CRD 334 to the GBUS driver 326.

For the read data to be correctly outputted to the DQ pads 212 at a time tDQSCK after the read latency RL (RL+tDQSCK, with tDQSCK being the clock to read DQS delay, which is an LPDDR4 JEDEC analog specified value of 1 to 4.5 nanoseconds), the global data bus GBUS 204 is driven by the GBUS driver 326 (FIG. 3) at RL-2. This allows the global data bus GBUS 204 propagation and the parallel-to-serial conversion of the read data to complete. The GBUS driver trigger signal CRlat is asserted (e.g., transitioning from a logic level low to a logic level high in FIG. 4) a predetermined number of clock cycles (two clock cycles in FIG. 4) before RL, which provides the GBUS driver 326 sufficient time to drive the corrected read data 208 to the global data bus GBUS 204. The corrected read data 208 is provided to the data input/output circuit 118 (FIG. 1 and FIG. 2), which performs a parallel to serial conversion 414 on the corrected read data 208 to produce serialized read data 210, which the data input/output circuit 118 provides to the I/O pads 212.

Following the first read command 416, the second read command 418 is received (e.g., by the memory cell array 114 (FIG. 1 and FIG. 2), and as a result, the memory cell array 114 may provide read data 402 corresponding to the second read command 418 to the ECC control circuit 300 via the MIO lines 202. The DSA enable signal CDAE may be asserted a predetermined period of time following second read command 418 (e.g., a predetermined period of time following the read CS signal corresponding to the second read command 416). As a result, the latch 304 latches the latched read data LDr 404, and the syndrome tree circuit 306 provides the ECC decode signal ECCDec 406 to the latch 318.

The latch signal CLDEF asserts (transitioning from a logic level high to a logic level low in FIG. 4) a predetermined period of time before RLL (about four clock cycles before RLL in FIG. 4, or RLL-4) to give the syndrome tree circuit 306 sufficient time to generate the ECC decode signal ECCDec 406. In response, the parity signal zldcorf 408 is latched to the decoder 320, the decoder 320 receives the zldcorf 408, and the correction circuit 322 receives the latched read data and the decoded signal associated with the second read command 418. The correction circuit 322 provides the CRD 334 (FIG. 3) to the GBUS driver 326.

The GBUS driver trigger signal CRlat is asserted (e.g., transitioning from a logic level low to a logic level high in FIG. 4) a predetermined number of clock cycles (two clock cycles in FIG. 4, or RLL-2) before RLL, which provides the GBUS driver 326 sufficient time to drive the corrected read data 410 to the global data bus GBUS 204. The corrected read data 410 is provided to the data input/output circuit 118 (FIG. 1 and FIG. 2), which performs a parallel to serial conversion 414 on the corrected read data 410 to produce serialized read data 412, which the data input/output circuit 118 provides to the I/O pads 212.

Figure 5:
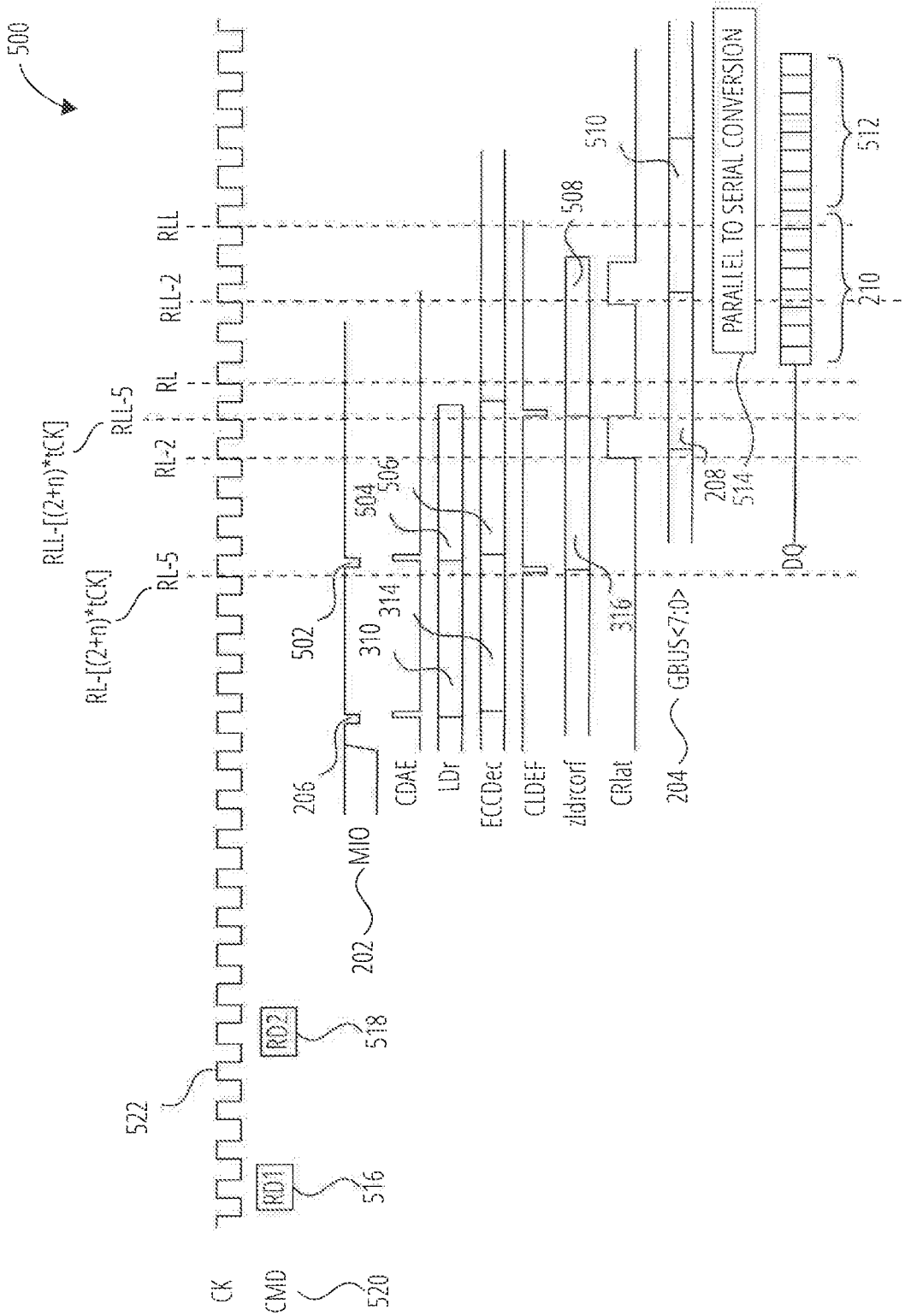
FIG. 5 is a signal timing diagram of example signals that may be observed in the ECC control circuit of FIG. 3 with a longer period of a clock signal than the clock signal of FIG. 4.

FIG. 5 is a signal timing diagram of example signals 500 that may be observed in the ECC control circuit 300 of FIG. 3 with a longer period of a clock signal 522 (CK) than the clock signal 422 of FIG. 4. Referring to FIG. 3 and FIG. 5 together, the signals 500 include the clock signal 522 (CK), commands 520 (CMD) including a first read command 516 and a second read command 518, read data 206 and read data 502 on MIO lines 202, DSA enable signal CDAE, latched read data LDr 310 and LDr 504, ECC decode signals ECCDec 314 and ECCDec 506, latch signal CLDEF, parity signals zldcorf 316 and zldcorf 508, GBUS driver trigger signal CRlat, corrected read data 208 and corrected read data 510 on global data bus GBUS 204, and serialized read data 210 and serialized read data 512 on I/O pads 212 (DQ).

The first read command 516 may be received (e.g., by the memory cell array 114 (FIG. 1 and FIG. 2), and as a result, the memory cell array 114 may provide the read data 206 to the ECC control circuit 300 via the MIO lines 202. The DSA enable signal CDAE may be asserted (by transitioning from a logic level low to a logic level high in FIG. 5) a predetermined period of time following the first read command 516 (e.g., following the read CS signal). As a result, the latch 304 latches the latched read data LDr 310, and the syndrome tree circuit 306 provides the ECC decode signal ECCDec 314 to the latch 318.

The latch signal CLDEF asserts (transitioning from a logic level high to a logic level low in FIG. 5) a predetermined period of time before RL at RL−[(2+n)*tCK]. In contrast to FIG. 4, which corresponds to an n=4 case due to the higher frequency of the clock signal CK of FIG. 4, the latch signal CLDEF of FIG. 5 may assert at RL-5, corresponding to an n=3 case. This may give the syndrome tree circuit 306 sufficient time to generate the ECC decode signal ECCDec 314. In response, the parity signal zldcorf 316 is latched to the decoder 320, the decoder 320 receives the parity signal zldcorf 316, and the correction circuit 322 receives the latched read data LLDr 312 and the decoded signal 332. The correction circuit 322 provides the CRD 334 to the GBUS driver 326.

The GBUS driver trigger signal CRlat is asserted (e.g., transitioning from a logic level low to a logic level high in FIG. 5) a predetermined number of clock cycles (two clock cycles in FIG. 5) before RL, which provides the GBUS driver 326 sufficient time to drive the corrected read data 208 to the global data bus GBUS 204. The corrected read data 208 is provided to the data input/output circuit 118 (FIG. 1 and FIG. 2), which performs a parallel to serial conversion 514 on the corrected read data 208 to produce serialized read data 210, which the data input/output circuit 118 provides to the I/O pads 212.

Following the first read command 516, the second read command 518 is received (e.g., by the memory cell array 114 (FIG. 1 and FIG. 2) from the column decoder 116 (FIG. 1)), and as a result, the memory cell array 114 may provide read data 502 corresponding to the second read command 518 to the ECC control circuit 300 via the MIO lines 202. The DSA enable signal CDAE may be asserted a predetermined period of time following second read command 418 (i.e., following the read CS signal). As a result, the latch 304 latches the latched read data LDr 504, and the syndrome tree circuit 306 provides the ECC decode signal ECCDec 506 to the latch 318.

The latch signal CLDEF asserts (transitioning from a logic level high to a logic level low in FIG. 5) a predetermined period of time before RL (e.g., five clock cycles before RL, or RL-5, in FIG. 5) to give the syndrome tree circuit 306 sufficient time to generate the ECC decode signal ECCDec 506. In response, the parity signal zldcorf 508 is latched to the decoder 320, the decoder 320 receives the zldcorf 508, and the correction circuit 322 receives the latched read data and the decoded signal associated with the second read command 418. The correction circuit 322 provides the corrected read data CRD to the GBUS driver 326.

The GBUS driver trigger signal CRlat is asserted (e.g., transitioning from a logic level low to a logic level high in FIG. 5) a predetermined number of clock cycles (two clock cycles in FIG. 5) before RLL, which provides the GBUS driver 326 sufficient time to drive the corrected read data 510 to the global data bus GBUS 204. The corrected read data 510 is provided to the data input/output circuit 118 (FIG. 1 and FIG. 2), which performs a parallel to serial conversion 514 on the corrected read data 510 to produce serialized read data 512, which the data input/output circuit 118 provides to the I/O pads 212.

In some embodiments the ECC control circuit 300 is configured to operate according to a first operational mode during which the clock CK is configured to cycle according to a first period (e.g., FIG. 4, tCK relatively short) and according to a second operational mode during which the clock is configured to cycle according to a second period that is longer than the first period (e.g., FIG. 5, tCK relatively long). In some such embodiments the GBUS trigger signal CRlat may assert the same predetermined number of clock cycles before RL (e.g., two clock cycles before RL, or RL-2), regardless of the difference between the first period and the second period. A number of predetermined clock cycles from a read command to the DSA enable signal CDAE, however, may be smaller in the second operational mode (longer tCk) than in the first operational mode (shorter tCK). Also, the latch signal CLDEF may assert a greater predetermined number of clock cycles prior to RL than in the first operational mode. By way of non-limiting example, in FIG. 4, which may correspond to a first operational mode (shorter period tCK), the latch signal CLDEF asserts four clock cycles prior to RL (RL-4) in contrast to FIG. 5, which may correspond to a second operational mode (longer period tCK), and in which the latch signal CLDEF asserts five clock cycles prior to RL (RL-5).

Figure 6:
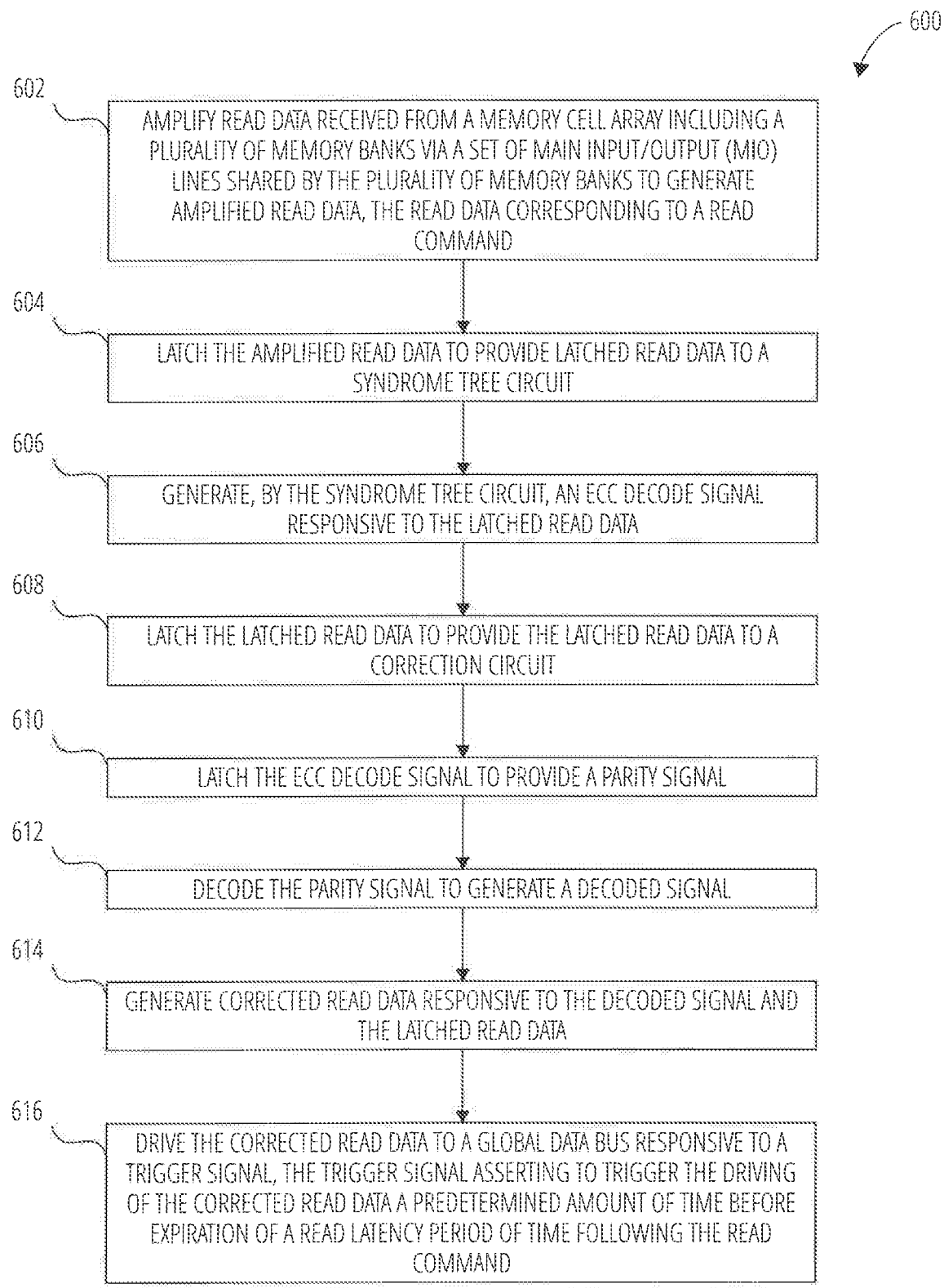
FIG. 6 is a flowchart illustrating a method of operating an ECC control circuit, according to some embodiments.

FIG. 6 is a flowchart illustrating a method 600 of operating an ECC control circuit, according to some embodiments. The ECC control circuit has a one-to-one relationship with input/output pads shared by a plurality of memory banks of a memory cell array. At operation 602 the method 600 includes amplifying read data received from a memory cell array including a plurality of memory banks via a set of MIO lines shared by the plurality of memory banks to generate amplified read data. The read data corresponds to a read command. In some embodiments amplifying the read data includes amplifying the read data using a digital sense amplifier (e.g., the DSA 302 of FIG. 3). In some embodiments amplifying the read data includes providing the read data to a digital sense amplifier and asserting a DSA enable signal (e.g., the CDAE of FIG. 3) to enable the digital sense amplifier.

At operation 604 the method 600 includes latching the amplified read data to provide latched read data to a syndrome tree circuit. In some embodiments, latching the amplified read data includes triggering a latch using the DSA enable signal. At operation 606 the method 600 includes generating, by the syndrome tree circuit, an ECC decode signal responsive to the latched read data. In some embodiments generating the ECC decode signal includes generating one or more parity bits based on the latched read data.

At operation 608 the method 600 includes latching the latched read data to provide the latched read data to a correction circuit. In some embodiments latching the latched read data includes triggering, with a latch signal, a latch provided with the latched read data. In some embodiments latching the latched read data includes latching the latched read data a predetermined amount of time before a read latency period of time expires. In some embodiments the predetermined amount of time before the read latency period of time expires is RL-[(2+n)*tCK].

At operation 610 the method 600 includes latching the ECC decode signal to provide a parity signal. In some embodiments latching the ECC decode signal includes latching the ECC decode signal with the same latch signal used in latching the latched read data in operation 608. At operation 612 the method 600 includes decoding the parity signal to generate a decoded signal. For example, the latch signal used to latch the ECC decode signal to provide the parity signal may be asserted at RL-[(2+n)*tCK]. In some embodiments decoding the parity signal includes decoding the parity signal using a decoder. In some embodiments decoding the parity signal to provide the parity signal includes providing the parity signal to indicate whether one or more errors are present in the latched read data.

At operation 614 the method 600 includes generating corrected read data responsive to the decoded signal and the latched read data. In some embodiments generating the corrected read data includes providing the read data as the corrected read data responsive to a determination that the decoded signal does not indicate an error in the read data, and correcting the read data and providing the corrected read data responsive to a determination that the decoded signal indicates an error in the read data.

At operation 616 the method 600 includes driving the corrected read data to a global data bus responsive to a trigger signal. The trigger signal asserts to trigger the driving of the corrected read data a predetermined amount of time (e.g., two clock cycles) before expiration of a read latency period of time following the read command.

Figure 7:
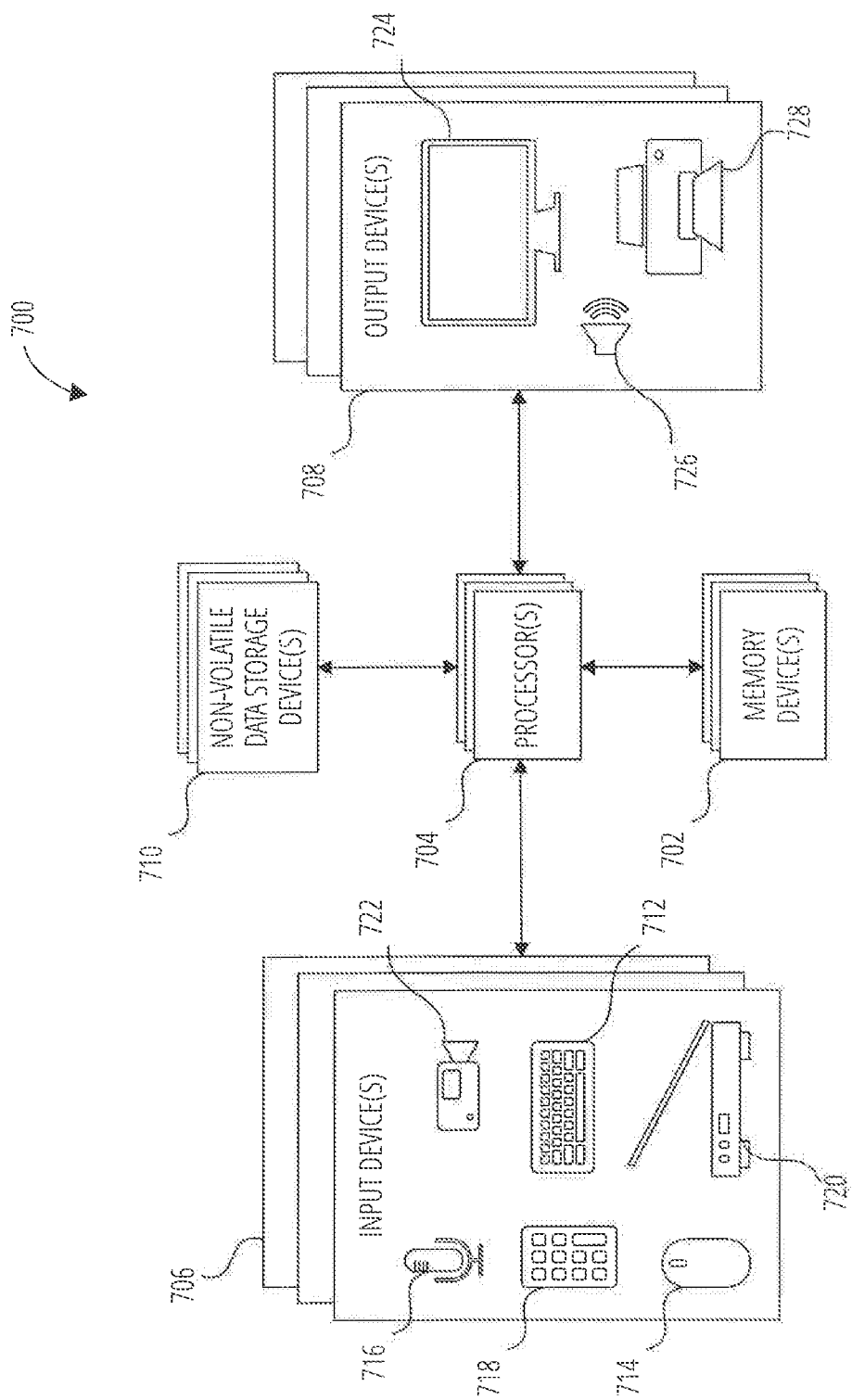
FIG. 7 is a block diagram of a computing system, according to some embodiments.

FIG. 7 is a block diagram of a computing system 700, according to some embodiments. The computing system 700 includes one or more processors 704 operably coupled to one or more memory devices 702, one or more non-volatile data storage devices 710, one or more input devices 706, and one or more output devices 708. In some embodiments the computing system 700 includes a personal computer (PC) such as a desktop computer, a laptop computer, a tablet computer, a mobile computer (e.g., a smartphone, a personal digital assistant (PDA), etc.), a network server, or other computer device.

In some embodiments the one or more processors 704 may include a central processing unit (CPU) or other processor configured to control the computing system 700. In some embodiments the one or more memory devices 702 include random access memory (RAM), such as volatile data storage (e.g., dynamic RAM (DRAM) static RAM (SRAM), etc.). In some embodiments the one or more non-volatile data storage devices 710 include a hard drive, a solid state drive, Flash memory, erasable programmable read only memory (EPROM), other non-volatile data storage devices, or any combination thereof. In some embodiments the one or more input devices 706 include a keyboard 712, a pointing device 714 (e.g., a mouse, a track pad, etc.), a microphone 716, a keypad 718, a scanner 720, a camera 722, other input devices, or any combination thereof. In some embodiments the output devices 708 include an electronic display 724, a speaker 726, a printer 728, other output devices, or any combination thereof.

In some embodiments the one or more memory devices 702 include the semiconductor device 100 of FIG. 1, the memory device 200 of FIG. 2, and/or the ECC control circuit 300 of FIG. 3. In some embodiments the one or more memory devices 702 are configured to generate a portion or the entirety of the signals 400 of FIG. 4 and/or the signals 500 of FIG. 5. In some embodiments the one or more memory devices 702 are configured to perform a portion or the entirety of the method 600 of FIG. 6.

Figure 8:
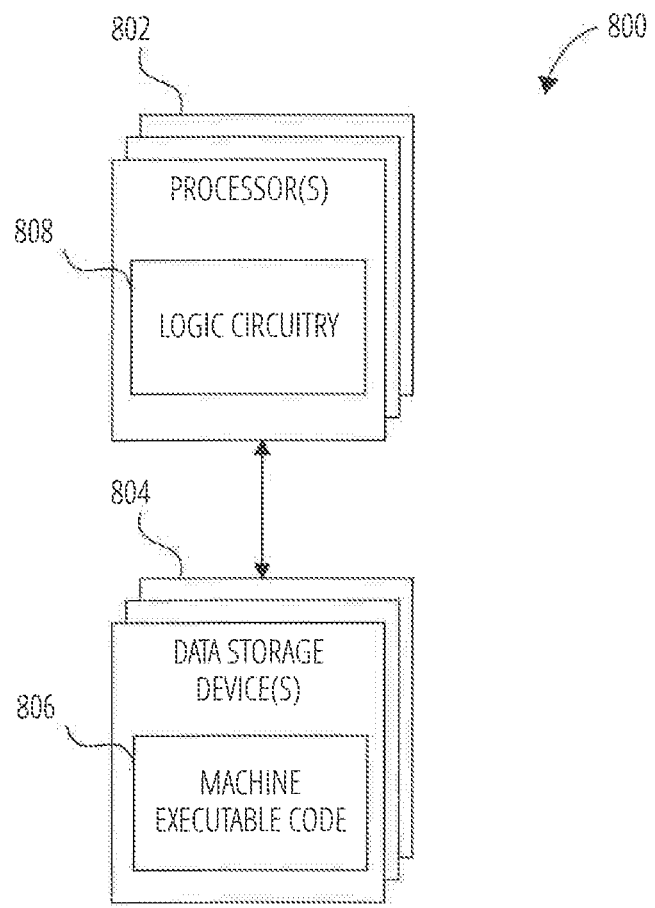
FIG. 8 is a block diagram of circuitry that, in some embodiments, may be used to implement various functions, operations, acts, processes, and/or methods disclosed herein.

It will be appreciated by those of ordinary skill in the art that functional elements of embodiments disclosed herein (e.g., functions, operations, acts, processes, and/or methods) may be implemented in any suitable hardware, software, firmware, or combinations thereof. FIG. 8 illustrates non-limiting examples of implementations of functional elements disclosed herein. In some embodiments, some or all portions of the functional elements disclosed herein may be performed by hardware specially configured for carrying out the functional elements.

FIG. 8 is a block diagram of circuitry 800 that, in some embodiments, may be used to implement various functions, operations, acts, processes, and/or methods disclosed herein. The circuitry 800 includes one or more processors 802 (sometimes referred to herein as "processors 802") operably coupled to one or more data storage devices (sometimes referred to herein as "storage 804"). The storage 804 includes machine executable code 806 stored thereon and the processors 802 include logic circuitry 808. The machine executable code 806 includes information describing functional elements that may be implemented by (e.g., performed by) the logic circuitry 808. The logic circuitry 808 is adapted to implement (e.g., perform) the functional elements described by the machine executable code 806. The circuitry 800, when executing the functional elements described by the machine executable code 806, should be considered as special purpose hardware configured for carrying out functional elements disclosed herein. In some embodiments the processors 802 may be configured to perform the functional elements described by the machine executable code 806 sequentially, concurrently (e.g., on one or more different hardware platforms), or in one or more parallel process streams.

When implemented by logic circuitry 808 of the processors 802, the machine executable code 806 is configured to adapt the processors 802 to perform operations of embodiments disclosed herein. For example, the machine executable code 806 may be configured to adapt the processors 802 to perform at least a portion or a totality of the method 600 of FIG. 6. As another example, the machine executable code 806 may be configured to adapt the processors 802 to perform at least a portion or a totality of the operations discussed for the ECC control circuit 300 of FIG. 1, FIG. 2, and FIG. 3.

The processors 802 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine executable code 806 (e.g., software code, firmware code, hardware descriptions) related to embodiments of the present disclosure. It is noted that a general-purpose processor (may also be referred to herein as a host processor or simply a host) may be a microprocessor, but in the alternative, the processors 802 may include any conventional processor, controller, microcontroller, or state machine. The processors 802 may also be implemented as a combination of computing devices, such as a combination of a DSP and a microprocessor, a plurality of microprocessors, one or more microprocessors in conjunction with a DSP core, or any other such configuration.

In some embodiments the storage 804 includes volatile data storage (e.g., random-access memory (RAM)), non-volatile data storage (e.g., Flash memory, a hard disc drive, a solid state drive, erasable programmable read-only memory (EPROM), etc.). In some embodiments the processors 802 and the storage 804 may be implemented into a single device (e.g., a semiconductor device product, a system on chip (SOC), etc.). In some embodiments the processors 802 and the storage 804 may be implemented into separate devices.

In some embodiments the machine executable code 806 may include computer-readable instructions (e.g., software code, firmware code). By way of non-limiting example, the computer-readable instructions may be stored by the storage 804, accessed directly by the processors 802, and executed by the processors 802 using at least the logic circuitry 808. Also by way of non-limiting example, the computer-readable instructions may be stored on the storage 804, transferred to a memory device (not shown) for execution, and executed by the processors 802 using at least the logic circuitry 808. Accordingly, in some embodiments the logic circuitry 808 includes electrically configurable logic circuitry 808.

In some embodiments the machine executable code 806 may describe hardware (e.g., circuitry) to be implemented in the logic circuitry 808 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, Verilog™ System- Verilog™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 808 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some embodiments the machine executable code 806 may include an HDL, an RTL, a GL description, a mask level description, other hardware description, or any combination thereof.

In embodiments where the machine executable code 806 includes a hardware description (at any level of abstraction), a system (not shown, but including the storage 804) may be configured to implement the hardware description described by the machine executable code 806. By way of non-limiting example, the processors 802 may include a programmable logic device (e.g., an FPGA or a PLC) and the logic circuitry 808 may be electrically controlled to implement circuitry corresponding to the hardware description into the logic circuitry 808. Also by way of non-limiting example, the logic circuitry 808 may include hard-wired logic manufactured by a manufacturing system (not shown, but including the storage 804) according to the hardware description of the machine executable code 806.

Regardless of whether the machine executable code 806 includes computer-readable instructions or a hardware description, the logic circuitry 808 is adapted to perform the functional elements described by the machine executable code 806 when implementing the functional elements of the machine executable code 806. It is noted that although a hardware description may not directly describe functional elements, a hardware description indirectly describes functional elements that the hardware elements described by the hardware description are capable of performing.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   an error correction code (ECC) control circuit input configured to receive read data from a plurality of memory banks of a memory cell array via a single set of shared main input/output (MIO) lines, the single set of shared MIO lines shared by the plurality of memory banks;

a single ECC control circuit configured to generate corrected read data responsive to the read data received by the ECC control circuit input; and an ECC control circuit output configured to provide the corrected read data generated by the single ECC control circuit to a global data bus, the single ECC control circuit comprising a global data bus driver configured to drive the corrected read data to the global data bus responsive to a global data bus trigger signal asserted a predetermined number of clock periods of time before expiration of a read latency period of time following a read command corresponding to the corrected read data.

2. The apparatus of claim 1, further comprising a data input/output (I/O) circuit configured to receive the corrected read data from the global data bus and provide serialized read data responsive to the corrected read data, wherein the data I/O circuit does not include a first-in, first-out (FIFO) buffer configured to interface with a plurality of ECC control circuits.

3. The apparatus of claim 2, further comprising a single set of I/O pads operably coupled to the data I/O circuit, the single set of I/O pads configured to provide the serialized read data, the single set of I/O pads having a one-to-one relationship with the single ECC control circuit.

4. The apparatus of claim 1, wherein the single ECC control circuit includes:
a digital sense amplifier configured to receive the read data from the ECC control circuit input and generate amplified read data responsive to a DSA enable signal received from the memory cell array;
a first latch configured to latch the amplified read data responsive to the DSA enable signal to provide latched read data;
a syndrome tree configured to generate an ECC decode signal including one or more parity bits responsive to the latched read data;
a second latch configured to latch the latched read data responsive to a latch signal;
a third latch configured to latch the ECC decode signal to provide a parity signal responsive to the latch signal;
a decoder configured to decode the parity signal to generate a decoded signal; and
a correction circuit configured to generate the corrected read data responsive to the latched read data and the decoded signal.

5. The apparatus of claim 1, wherein the predetermined number of clock periods of time is two clock periods of time.

6. An apparatus, comprising:
a plurality of memory banks configured to store data thereon;
a single set of input/output (I/O) pads shared by the plurality of memory banks;
a data I/O circuit electrically connected to the single set of I/O pads;
a global data bus operably coupled to the data I/O circuit; and
a single error correction code (ECC) control circuit electrically connected between the plurality of memory banks and the data I/O circuit, the single ECC control circuit having a one-to-one relationship with the single set of I/O pads, the single ECC control circuit configured to:
receive read data read from the plurality of memory banks; and
provide corrected read data to the global data bus responsive to the read data;

wherein the single ECC control circuit includes a global data bus driver configured to provide the corrected read data to the data I/O circuit a predetermined number of clock cycles before expiration of a read latency period of time after a read command corresponding to the corrected read data.

7. The apparatus of claim 6, wherein the single ECC control circuit includes a correction circuit configured to generate the corrected read data responsive to the read data and a decoded signal corresponding to one or more decoded parity bits generated responsive to the read data.

8. The apparatus of claim 7, wherein the correction circuit is configured to determine whether the read data includes errors responsive to the decoded signal.

9. The apparatus of claim 8, wherein the correction circuit is further configured to provide the read data as the corrected read data responsive to a determination that the read data does not include errors.

10. The apparatus of claim 8, wherein the correction circuit is further configured to correct the read data and provide the corrected read data responsive to a determination that the read data includes errors.

11. The apparatus of claim 6, wherein the single ECC control circuit includes a syndrome tree circuit configured to generate one or more parity bits responsive to the read data.

12. The apparatus of claim 11, wherein the single ECC control circuit does not include ECC replica logic configured to model delay of the syndrome tree circuit.

13. A method of operating an Error Correction Code (ECC) control circuit having a one-to-one relationship with input/output pads shared by a plurality of memory banks of a memory cell array, the method comprising:
generating a parity signal responsive to read data received from the memory cell array, the read data corresponding to a read command;
decoding the parity signal to generate a decoded signal;
generating corrected read data responsive to the decoded signal and the read data; and
driving the corrected read data to a global data bus a predetermined amount of time before expiration of a read latency period of time following the read command.

14. The method of claim 13, further comprising:
amplifying the read data received from the memory cell array to generate amplified read data; and
latching the amplified read data to provide latched read data, wherein generating the parity signal responsive to the read data and generating the corrected read data responsive to the read data comprises generating the parity signal and generating the corrected read data responsive to the latched read data.

15. The method of claim 13, wherein generating the parity signal comprises:
applying the read data to a syndrome tree circuit to generate an ECC decode signal; and
latching the ECC decode signal to provide the parity signal to a decoder.

16. The method of claim 13, wherein driving the corrected read data to the global data bus a predetermined amount of time before the expiration of the read latency period of time comprises driving the corrected read data to the global data bus two clock cycles before the expiration of the read latency period of time.

17. The method of claim 13, wherein generating corrected read data responsive to the decoded signal and the read data comprises:

providing the read data as the corrected read data responsive to a determination that the decoded signal does not indicate an error in the read data; and correcting the read data and providing the corrected read data responsive to a determination that the decoded signal indicates an error in the read data.

18. The method of claim 13, wherein driving the corrected read data to the global data bus a predetermined amount of time before the expiration of the read latency period of time comprises providing the corrected read data to a global data bus driver and asserting a trigger signal provided to the global data bus the predetermined amount of time before the expiration of the read latency period of time.

19. An apparatus comprising:

a digital sense amplifier (DSA) configured to receive read data from any of a plurality of memory banks, the DSA configured to enable the DSA to operate responsive to an assertion of a DSA enable signal, the assertion of the DSA signal occurring a first predetermined number of clock cycles of a clock following a read command to retrieve the read data from the plurality of memory banks;

a first latch configured to receive the read data and latch the read data to provide latched read data responsive to the DSA enable signal;

a syndrome tree circuit configured to receive the latched read data and generate one or more parity bits responsive to the latched read data;

a second latch configured to latch the one or more parity bits from the syndrome tree circuit responsive to an assertion of a latch signal, the assertion of the latch signal occurring a second predetermined number of clock cycles prior to a read latency time, the read latency time occurring a read latency period of time following the read command, the second predetermined number of clock cycles sufficient to provide the syndrome tree circuit sufficient time to generate the one or more parity bits;

a decoder configured to generate a decoder signal responsive to the one or more latched parity bits;

a correction circuit configured to generate corrected read data responsive to the latched read data and the decoder signal; and a global data bus (GBUS) driver configured to drive the corrected read data to a GBUS responsive to an assertion of a GBUS driver trigger signal, the GBUS driver trigger signal configured to assert a third predetermined number of clock cycles prior to the read latency time.

20. The apparatus of claim 19, wherein the third predetermined number of clock cycles is two clock cycles.

21. The apparatus of claim 19, wherein the apparatus is configured to operate according a first operational mode during which the clock is configured to cycle according to a first period and according to a second operational mode during which the clock is configured to cycle according to a second period that is longer than the first period.

22. The apparatus of claim 21, wherein the third predetermined number of clock cycles is the same during the first operational mode as during the second operational mode.

23. The apparatus of claim 21, wherein the first predetermined number of clock cycles is smaller in the second operational mode than in the first operational mode.

24. The apparatus of claim 21, wherein the second predetermined number of clock cycles is greater in the second operational mode than in the first operational mode.

25. The apparatus of claim 21, wherein the second predetermined number of clock cycles is five (5) in the second operational mode and four (4) in the first operational mode.

* * * * *

UNITED STATES PATENT AND TRADEMARK OFFICE
CERTIFICATE OF CORRECTION

| | |
|---|---|
| PATENT NO. | : 11,373,725 B2 |
| APPLICATION NO. | : 16/912214 |
| DATED | : June 28, 2022 |
| INVENTOR(S) | : Zer Liang, Minari Arai and Takuya Nakanishi |

It is certified that error appears in the above-identified patent and that said Letters Patent is hereby corrected as shown below:

In the Specification
Column 7, Line 11, change "signal/CK are" to --signal /CK are--

Signed and Sealed this
Twenty-seventh Day of September, 2022

*Katherine Kelly Vidal*

Katherine Kelly Vidal
*Director of the United States Patent and Trademark Office*